United States Patent [19]

Xiang-Zheng et al.

[11] Patent Number: 5,242,863

[45] Date of Patent: Sep. 7, 1993

[54] SILICON DIAPHRAGM PIEZORESISTIVE PRESSURE SENSOR AND FABRICATION METHOD OF THE SAME

[76] Inventors: Tu Xiang-Zheng, Department of Electrical Engineering, University of Pennsylvania, 200 S. 33rd St., Philadelphia, Pa. 19104-6390; Li Yun-Yan, 14 Beihehutong Congcheuggu, Beijing, China

[21] Appl. No.: 830,559

[22] Filed: Jun. 7, 1991

[30] Foreign Application Priority Data

Jun. 8, 1990 [CN] China .............................. 9010415.9

[51] Int. Cl.⁵ ..................................... H01L 21/465
[52] U.S. Cl. ..................................... 437/228; 437/7;
437/71; 437/901; 437/927; 257/108; 257/254;
257/419; 156/647; 156/653; 148/DIG. 128
[58] Field of Search ................... 357/51; 437/228, 901,
437/2-7, 71, 927, 985; 156/647, 653; 29/610;
73/721, 727; 148/128, 138; 147/117; 257/108,
254, 419

[56] References Cited

U.S. PATENT DOCUMENTS

| | | | |
|---|---|---|---|
| 4,665,610 | 5/1987 | Barth | 437/228 |
| 4,744,863 | 5/1988 | Guckel et al. | 156/653 |
| 4,766,666 | 8/1988 | Sugiyama et al. | 29/610 |
| 4,771,638 | 9/1988 | Sugiyama et al. | 73/721 |
| 4,889,590 | 12/1989 | Tucker et al. | 156/647 |
| 4,893,509 | 1/1990 | MacIver et al. | 156/647 |
| 4,945,769 | 8/1990 | Sidner et al. | 73/727 |
| 4,975,390 | 12/1990 | Fujii et al. | 437/228 |
| 4,993,143 | 2/1991 | Sidner et al. | 29/621 |
| 5,095,401 | 3/1992 | Zavracky et al. | 357/51 |

Primary Examiner—Olik Chaudhuri
Assistant Examiner—H. Jey Tsai
Attorney, Agent, or Firm—Heslin & Rothenberg

[57] ABSTRACT

A silicon diaphragm piezoresistive pressure sensor having a diaphragm formed by a single-sided fabrication method. The pressure sensor is made up of a substrate on which there is a diaphragm at or near the surface of the substrate with a chamber under the diaphragm. The pressure sensor is fabricated by undercutting a silicon substrate to form a diaphragm and a cavity within the bulk of the substrate under the diaphragm. The fabricating steps including a) forming a buried low resistive layer under a predetermined diaphragm region; b) converting the low resistance layer into porous silicon by anodization of silicon in a concentrated hydrofluoric acid solution; c) removing the porous silicon by selective etching; d) filling the openings formed in the etching of porous silicon with a deposited material to form a sealed reference chamber. Adding appropriate means to the exterior of the diaphragm and substrate to detect changes in pressure between the reference chamber and the surface of the substrate.

14 Claims, 4 Drawing Sheets

SILICON DIAPHRAGM PIEZORESISTIVE PRESSURE SENSOR AND FABRICATION METHOD OF THE SAME

This application is based on a patent application filed by the inventors in the Peoples Republic of China at the Patent Office of the Peoples Republic of China, Beijing, China on Jun. 8, 1990. The application when filed was given filing number 9010415.9 and the applicants will be seeking the designation of Jun. 8, 1990 as the priority date pursuant to 35USC119.

FIELD OF THE INVENTION

This invention relates to a silicon diaphragm pressure sensor, specifically an improved silicon diaphragm piezoresistive pressure sensor which is made by using a single-sided processing and a fabricating method.

BACKGROUND OF THE INVENTION

The designing and manufacturing of silicon pressure sensors is a constantly developing art. The applications of small pressure sensors is constantly expanding because of their utility, due among other things to their small size, in many commercial applications. Among the commercial applications are in medical equipment such as blood pressure monitors, in air conditioning systems and toys. The use of small pressure sensor devices in the automotive industry is extensive, they are used in anti-lock braking devices, dynamatic suspension, crashbag or airbag activation, tire pressure monitoring, etc. There are many other industrial applications where small pressure transducers or sensors can be used, such as in chemical plants, food and beverage facilities, petrochemical plants, etc.

Given the small size of pressure sensors, the need for mass production while at the same time producing a high percentage of high quality sensors there is a persistent need to find a more efficient and effective way to manufacture them. Prior art includes: (a) conventional silicon pressure sensor fabricating method, the one most widely adopted by manufacturers which is based on a back-sided etching process; (b) a silicon fusion bonding method, which is a new technique used by some manufacturers and; (c) a single-sided process method different variations of which have been described in recently issued U.S. patents.

The conventional and most widely used manufacturing process of silicon diaphragm piezoresistive pressure sensors has a number of problems due in part the use of the back-sided etching processes. First, the processing steps are complicated, because a double-sided process is required which among other things requires a precise lining up of structures and work to be done on both sides of the substrate. Additionally, it is difficult to precisely control the thickness of the diaphragm made during fabrication which consequently affects the accuracy and sensitivity of the diaphragm. Also it is not easy to make the dimensions of the diaphragm of a sufficiently small size necessary for certain uses. Finally, it is necessary to bond the sensor chip to a glass or like base to form a hermetic reference chamber. All these problems are obstacles to improvements of the performance and to reduction of production costs of the current devices in use.

An example of the current types of manufactured silicon pressure sensors is set forth in FIG. 1a and b. FIG. 1a and b shows the general structure of a conventional silicon diaphragm piezoresistive pressure sensor. This silicon diaphragm piezoresistive pressure sensor includes a N-type silicon substrate 10 and a diaphragm 12 having P-type regions 14 on the surface. The substrate is etched from the back side to form the diaphragm.

There are two back-sided etching techniques widely used. One is a chemical etch-stop at a heavily boron-doped (about $10^{20}$ cm$^{-3}$) layer. When a silicon epitaxial layer having a heavily boron-doped layer sandwiched in between an epitaxial layer and a substrate is etched by ethylene diamine pyrocatechol (EDP), the substrate is removed and the epitaxial layer is left. The other method is an electrochemical etch-stop process at a reverse-biased P-N junction. This technique combines an anodic passivation characteristic of silicon with a reverse-bias P-N junction to provide a large etching selectivity of P-type silicon over N-type silicon in anisotropic etchants such as a potassium hydroxide/water and hydrazine/water. When a positive voltage is applied to the N-type layer of a N/P epitaxial wafer immersed in hydroxide water or hydrazine/water etching can be stopped at the P-N junction.

Compared to the conventional silicon pressure sensor fabrication method, the present invention has the following advantages:

A. The present invention enables the sensor to be fabricated by what is called a single-sided processing method wherein all the processing steps are conducted solely on the upper side of the silicon substrate. Accordingly, the diaphragm and the reference pressure chamber are all formed by processing the substrate from one side. This greatly simplifies the manufacturing method compared to the conventional method which, and among other things, leads to a substantial reduction in production costs.

B. It is possible to form a diaphragm with a high degree of accuracy and avoid the problems caused by a lack of uniformity of thickness of the silicon substrate, a perennial problem with the present double-sided manufacturing method. Consequently, it is possible to fabricate diaphragms of relatively small and highly accurate dimensions in reference to a predetermined crystal plain dimension of the substrate. The ability to form a diaphragm of a predetermined and reduced thickness and dimension with high accuracy allows the production of sensors of much higher sensitivity and accuracy as compared to those made by current manufacturing methods.

C. Since the reference pressure chamber is formed within the bulk of the silicon substrate from one side, an absolute pressure sensor is formed with an air tight seal all which can be done by an integrated circuit fabrication techniques. The conventional manufacturing method has a persistent problem in providing for air tight bonding between the diaphragm and the base material a serious obstacle to effective and efficient mass production. Obviously with the technique as described herein with its simplified fabrication process the actual cost of manufacturing accurate and small pressure sensors can be substantially reduced.

D. The present invention enables the silicon pressure sensor to be formed by integrated circuit manufacturing techniques. This is possible because all of the processing steps are conducted by a one-sided processing method as described herein, consequently it is easy to design and treat the silicon pressure sensor itself as one element of an integrated circuit because the techniques of both manufacturing integrated circuits and the pressure sensor as described herein are substantially the same techniques. This allows for manufacture of combined pressure sensor and integrated circuits of predetermined signal processing characteristics with appropriate circuits, amplification and whatever addition devices are necessary for the use of the pressure sensor.

Another current fabrication technique used by some manufacturers is a silicon fusion bonding method. There are a number of problems with this technique: (A) The bonding of two silicon wafers together which is part of the process requires a high degree of cleanness and flatness of surfaces. In silicon fusion bonding the forces used are small and have short range so that surface roughness and dust particles can create major problems. Surface roughness and particles may prevent bonding or cause large "tent" areas several millimeters in diameter even if bonding is successful. In the manufacturing of absolute silicon pressure sensors such problems are totally unacceptable. (B) After the fusion bonding of two silicon wafers, other steps in this manufacturing process require the thinning to a predetermined thickness one of the wafers by conventional etching techniques. These conventional etching techniques create problems in the fabrication of a pressure sensor which can display a sufficiently high enough sensitivity for use in many applications.

Finally, recently issued U.S. patents have described single-sided processing methods which do take advantage of the single-sided process. However these patents described methods where the diaphragm and chamber are formed by orientation dependent etching through a small hole or holes on the upper side of a silicon substrate. The thickness and size of the diaphragm, as well as the dimensions of the chamber are determined by the length of time the actual etching process is allowed to proceed during the manufacturing process. How long the etching process is allowed to proceed is based on prior experience with etching speeds. However, the etching speed has a tendency to change during the process due to a number of factors, among them being the fact that the chamber which is being formed is becoming larger and effecting the etching process. As a result, it is impossible to make the diaphragm sufficiently uniform and thin. Nor is it possible to control or predetermine the actual size of the chamber.

SUMMARY OF THE INVENTION

The object of the present invention is to solve the problems mentioned above and to provide a silicon diaphragm pressure sensor which is fabricated by forming a diaphragm with a chamber underlaying the diaphragm within the substrate using a single-sided processing and fabrication method.

The present invention is a silicon diaphragm pressure sensor and its method of fabrication. It has a substrate generally of some type of silicon or similar material, a diaphragm at or near the surface of the substrate with one or more P-type resistance regions, or using piezoresistors or other mechanical or electrical devices on the diaphragm surface to sense changes in pressure. The diaphragm is supported by the substrate and the diaphragm has underlaying it within the substrate a cavity which is closed by the substrate and the diaphragm to form a sealed reference pressure chamber alternatively referred to as an absolute reference chamber.

Using standard integrated circuit manufacturing technology, the present invention is fabricated by (a) forming a buried layer in the substrate with a cavity material that can be later altered and removed without affecting the surrounding material or structure, (b) forming a layer of diaphragm material over the location of the cavity material at the level of the surface of the substrate the diaphragm being composed of material that will be unaffected by the process used to remove the cavity material, (c) providing for one or more trenches (a technical term used to describe an opening in the shape of a trench, shaft or column in semiconductor or integrated circuit technology, the meaning it will have herein) which run from the surface of the substrate or diaphragm down to the cavity or chamber and the material buried within the cavity or chamber (d) filling the trenches with the same material as the cavity material. Then removing the material in the cavity or chamber by appropriate means through the trenches which contain the same material as the cavity material in such a way as to not affect the diaphragm material or substrate material and than filling the trenches with a deposited material to seal the cavity underlaying the diaphragm. Appropriate means is added to the surface of the diaphragm and substrate to detect and transmit changes in pressure between the buried sealed cavity or chamber and the surface of the diaphragm. Typically such means is an integrated circuit with one or more stain gages or piezoresistive elements with other appropriate elements and circuits to process and transmit appropriate information.

The present invention, more particularly a pressure sensor of the type described above can be fabricated by using as a base a semiconductor substrate such as an N-type substrate of (100) lightly doped silicon with a carrier concentration between $10^{15}$ and $10^{16}$ cm$^{-3}$ and altering it with the following processes:

a) Forming a buried low resistance N-type layer under a predetermined diaphragm region of the substrate by diffusion or ion implantation;

b) Forming the predetermined diaphragm region;

c) Creating one or more trenches located at the edge of the predetermined diaphragm region which trenches run from the surface to low resistance N-type material which is under the predetermined diaphragm region, the trenches being filled with the same low resistance N-type layer;

d) Converting the low resistance N-type material in the trenches and the buried low resistance N-type layer into porous silicon by anodization of silicon in a concentrated hydrofluoric acid solution through the one or more trenches of low resistance N-type material which are located at the edge of the predetermined diaphragm region e) Removing the porous silicon by selective etching of the porous silicon material in the trenches and the porous silicon material within the substrate under the diaphragm to form a cavity or chamber under the diaphragm;

f) filling the trenches with a deposited material to seal the cavity to form a buried reference chamber;

g) adding piezoresistive and other types of circuit elements to the exterior surface of the diaphragm and substrate.

According to the present invention, in one mode the diaphragm and buried low resistance layer can be formed by combining diffusion and ion implantation to form the buried low resistance layer in the cavity and vapor phase epitaxy to form the diaphragm or overlayer. Several low resistance N-type trenches, are formed at the edge of the predetermined diaphragm region by diffusion. The silicon in the trenches and buried low resistance layer in the cavity or chamber is then converted to a porous silicon and removed by etching. The trenches then being filled to seal the cavity or chamber beneath the diaphragm.

According to a second mode, the diaphragm and the low resistance layer beneath it and the adjacent trenches with low resistance material are formed by a double ion implantation process. The buried low resistance layer and the low resistance material in the trenches, is then converted to porous silicon which is removed by etching and the cavity or chamber is sealed.

BRIEF DESCRIPTION OF THE DRAWINGS

FIGS. 3a to 3k are cross sectional views showing sequential steps of one fabricating process of the present invention. The cross sectional view in along line A—A of FIG. 2a.

FIGS. 4a to 4i are cross sectional views showing sequential steps of a second fabricating process of the present invention. The cross sectional view is along line A—A of FIG. 2a.

DETAILED DESCRIPTION OF THE PREFERRED EMBODIMENT

Figure 1A:
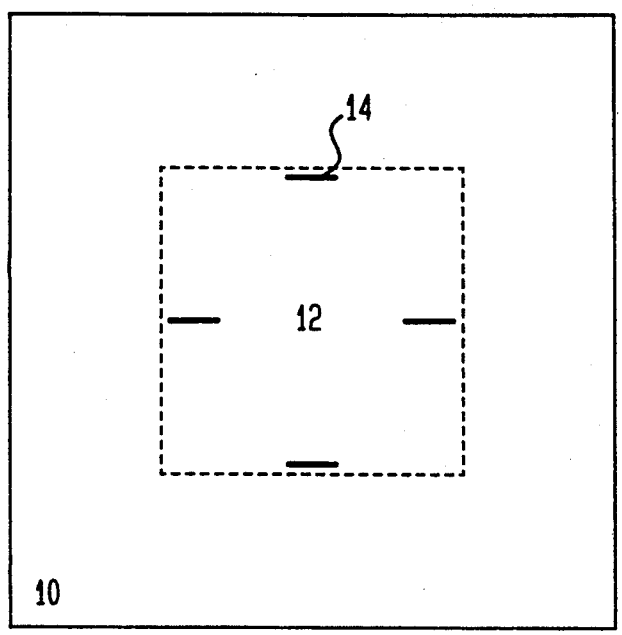
FIG. 1A and 1B show a conventional piezoresistive pressure sensor (a) plan view and (b) sectional view.
Figure 1B:
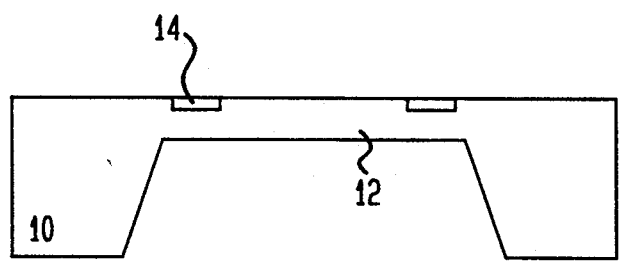
Figure 2A:
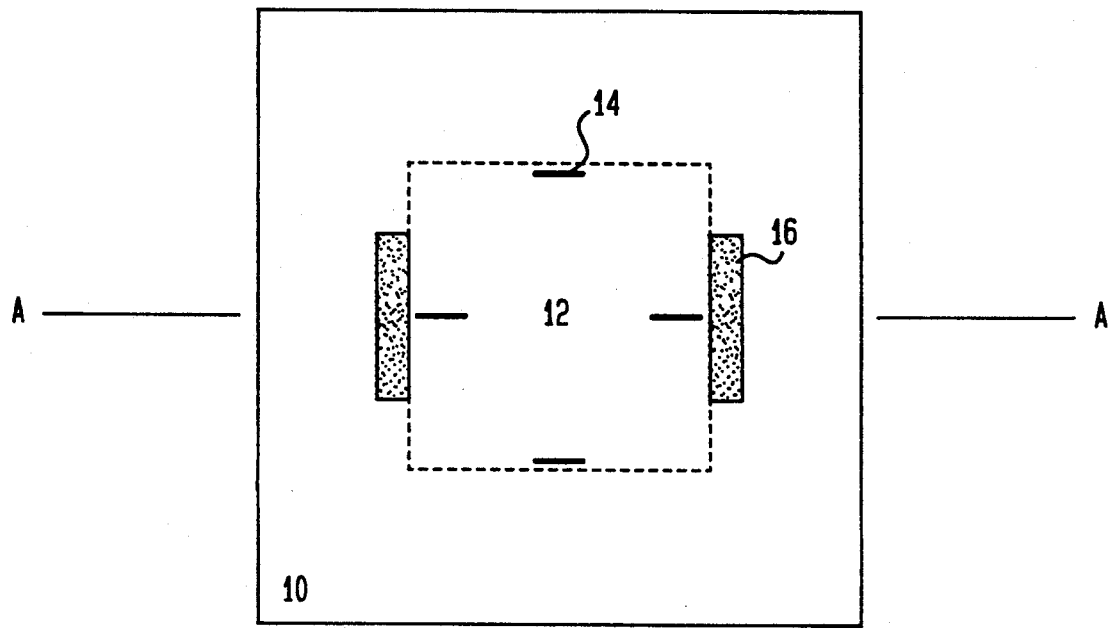
FIG. 2A and 2B show a piezoresistive pressure sensor of an embodiment of the present invention (a) plan view and (b) sectional view.

FIG. 2a is a top view of the pressure sensor as it is fabricated by both of the methods described below the insulation layers and contact layers being omitted. The final version is in a chip form with the actual silicon or semiconductor substrate being marked 10, the diaphragm region being marked 12, and the strain gauges, or as it is set forth in the preferred embodiment piezoresistive elements of which there are one or more on the top of the diaphragm surface, are marked 14. Finally the trenches which have been filled and sealed with either a polysilicon or silicon crystal are marked 16.

Figure 2B:
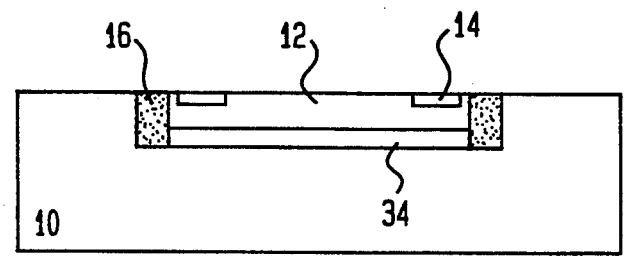

FIG. 2b is a cross sectional view of the basic structures of the fabricated chip as it is fabricated both by the first and second method as described below. The cross sectional view is along line A—A of FIG. 2a. The basic structures depicted are common to pressure sensors manufactured by both methods. The silicon or semiconductor substrate is numbered 10. The evacuated and clear chamber or cavity or pressure reference chamber as it is also described is marked 34. The actual silicon diaphragm is marked 12. However in FIG. 3k which shows the completed pressure sensor manufactured according to mode 1 the diaphragm is labeled 24 and in FIG. 4i which shows the completed pressure sensor according to the second fabrication method is marked 42. The trenches which contain sealing material of silicon either poly or crystal silicon are marked 16. It should be noted that the trenches regions referred to in the second method of fabrication and the trenches referred to in the first method of fabrication are equivalent. The trenches 16 or trench regions 16 into to which the sealing silicon is put after the cavity or chamber is created do not surround the entire diaphragm region. And, in fact as can be seen from the overview in FIG. 2a, the diaphragm is supported in part by the substrate. This support by the substrate is provided and during the manufacturing process FIG. 3k is a cross sectional view at line A—A of FIG. 2a of the pressure sensors major elements after fabrication or manufacture by the first method described below. There is the basic substrate 10 in which there has been created a chamber 34, said chamber being overlaid by a diaphragm 24 with sealing means of silicon either crystal or polysilicon deposited in the trenches 16; with strain gauges or, in the preferred embodiment, piezoresistive elements 14 with metal contacts or conducting layer 36 running to the strain gauges or piezoresistive elements 14 with an insulating layer 38 and a passivation layer 40 for insulation and protection of the cavity or chamber under the diaphragm and rests on the diaphragm from the outside. Bonding pads 46 which are located on a portion of the conducting band 36 and additional passivation or insulation layer 39. The conducting layer would generally be aluminum or gold.

Figure 4A:
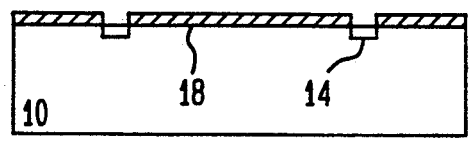
Figure 4F:
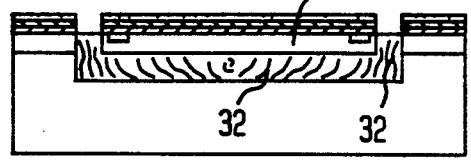
Figure 4B:
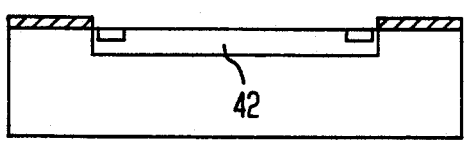
Figure 4G:
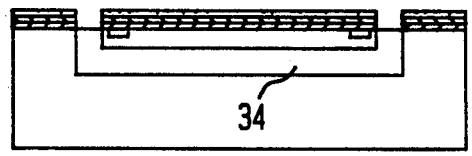
Figure 4C:
Figure 4H:
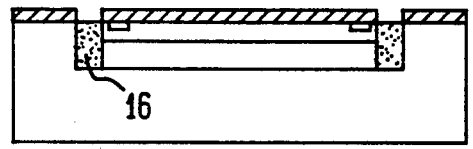
Figure 4D:
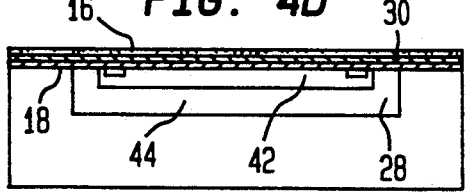
Figure 4I:
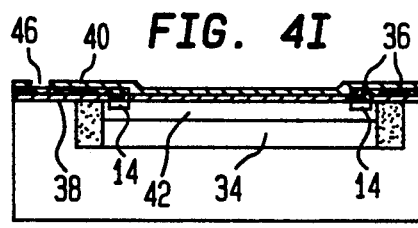

FIG. 4i is a cross sectional view of the pressure sensor along line A—A of FIG. 2a showing the major elements of the pressure sensor after it has been fabricated or manufactured according to second method of fabrication described below. The basic pressure sensor includes the substrate of a semiconductor silicon material 10, an evacuated chamber or cavity 34. A diaphragm 42 covers or overlays the chamber. Adjacent to the diaphragm 42 are trenches which extend from the top of the substrate down to the chamber or cavity and into which a poly or crystal silicon has been filled to sealed the chamber or cavity 34. Strain gages or piezoresistive elements are designated 14 on the diaphragm surface. An insulating layer which can be of boro-phosphate-silicate glass is designated by 38. The contact layer 36 by which the contact is made with the strain gauge or piezoresistive elements are also include. The contact layer would generally be made of metal such as aluminum or gold. A passivation layer 40 is laid across the top of the entire device to provide protection. Among the substances that can be used would be phospho-silicate glass or silicon nitride. Bonding pads 46 on the specified portion of the contact layer 36 complete the basic elements.

The bonding pads 46 in both 3k and 4i are used for bonding leads which connect between the chip or pressure sensor and elements or devices off the chip or pressure sensor.

The pressure sensor of the FIG. 3a through 3k is in a chip form and is fabricated by standard integrated circuit technology. One embodiment of the finished chip with a completed pressure sensor and related circuitry is set forth in FIG. 3k can typically have a dimension of 0.5 mm ×0.5 mm ×400 microns and contain a square diaphragm 12 having a dimension of 0.2 mm ×0.2 mm ×6.5 microns. Under the diaphragm there is a cavity or chamber 34 which can have a size of 0.2 mm ×0.2 mm ×4 microns. The cavity is closed by the diaphragm and the substrate 10 and the openings into the cavity trenches 28, are filled with a deposited material 16. On the surface of the diaphragm there can be circuitry containing among other things four resistors laid out in the <110> direction which are interconnected to form a Wheastone Bridge circuit.

Each figure of the FIG. 3a through 3k shows a fabricating step of the pressure sensor.

Figure 3A:
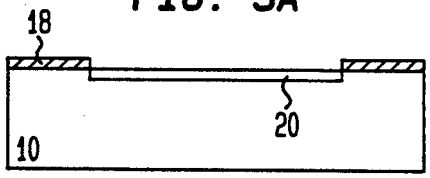
Figure 3G:
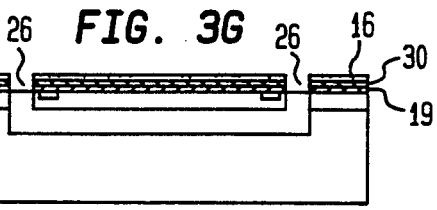

At the step shown in FIG. 3a, in the preferred technique of fabrication a (100) N-type silicon substrate 10 having a concentration of $3 \times 10^{15}$ cm$^{-3}$ is oxidized to form a first silicon dioxide layer 18 having a thickness of typically 1.2 microns. Then a pattern is formed on the surface of the substrate 10 by photoetching. This pattern is used to define an ion implantation region 20. After the silicon dioxide 18 in the defined region is removed, an arsenic ion implantation is performed using the patterned silicon dioxide layer as a mask to form the low resistance layer 22 FIG. 3b.

Figure 3B:
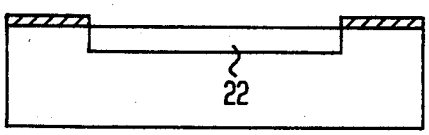
Figure 3H:
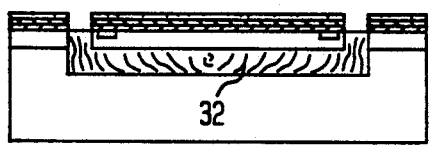

At the step shown in FIG. 3b, thermal annealing at a temperature between 1000 and 1100 Degrees centigrade is performed to heal the crystal damage and drive in the implanted ions to form a low resistance layer 22 having a thickness of about 4 microns.

Figure 3C:
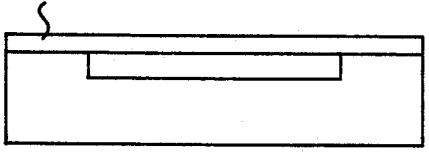
Figure 3I:
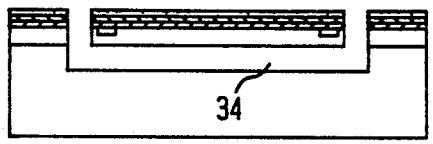

At the step shown in FIG. 3c, after the first silicon dioxide layer 18 is removed by etching, vapor phase epitaxy of silicon is carried out to form a N-type silicon layer 24 which typically can have a carrier concentration of $3 \times 10^{15}$ cm$^{-3}$ and a thickness of about 7 microns over the surface of the substrate.

Figure 3D:
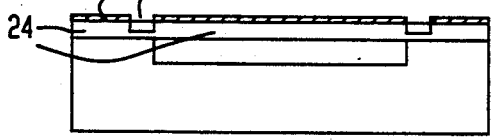
Figure 3J:
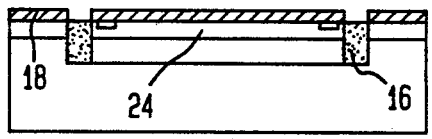

At the step shown in FIG. 3d, the substrate with an epitaxial layer at the top is thermally oxidized to form a second silicon dioxide layer 19 having a thickness of 2000 Augstroms. A pattern defined by phosphorous ion implantation regions 26 on the surface of the epitaxial layer 24 is formed by photoetching. After removing the silicon dioxide 19 in the defined region, phosphorous ion implantation is carried out using the patterned silicon dioxide layer as a mask.

Figure 3E:
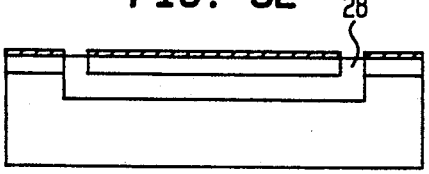
Figure 3K:
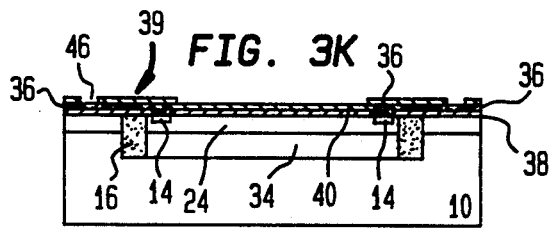

At the step shown in FIG. 3e, annealing is performed at a temperature between 900 and 1100 Degrees Centigrade. This process forms some low resistance trenches 28 at the edge of the buried low resistance layer 22. These trenches penetrate the epitaxial layer and connect with the buried low resistance layer under the epitaxial layer 24. Silicon dioxide is then redeposited on the region phosphorous ion implantation regions 26.

Figure 3F:
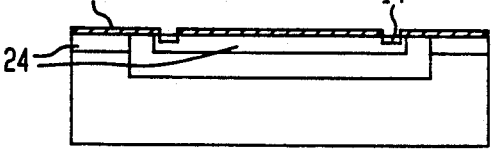

At the step shown in FIG. 3f, a pattern is formed in the second silicon dioxide layer 19 to define boron ion implantation regions 14. Boron ion implantation is carried out to form resistors 14 having a predetermined surface carrier concentration and a predetermined resistance value.

At the step shown in FIG. 3g, a silicon nitride layer 30 typically having a thickness of 1500 Angstroms and a high resistance polysilicon layer 16 is formed over the surface of the substrate. This composite layer of silicon dioxide, silicon nitride and polysilicon can be used as an insulating and hydrofluoric-acid-resisting mask in the next anodization process. Then a pattern is formed in this composite layer by photoetching. This pattern is aligned with the pattern of the phosphorous ion implanted regions 26.

At the step shown in FIG. 3h, the low resistance trenches 28 and the buried low resistance layer 22 are converted into porous silicon 32 by anodization. The hydrofluoric acid concentration that can be used is 30 w% to 50 w%. The anodic voltage that can be used is 5 to 7 volts. The anodization process automatically stops after all low resistance silicon converts into porous silicon.

At the step shown in FIG. 3i, the porous silicon is removed by etching in a 5 w% potassium hydroxide solution.

At the step shown in FIG. 3j, the openings trenches formed in the etching of the porous silicon are filled with polysilicon 16 which is deposited by low pressure chemical vapor deposition. As a result, the cavity 34 formed in the etching of the porous silicon is sealed to form an internal chamber within the bulk of the substrate. The unnecessary part of the deposited polysilicon layer is removed by photoetching. As an alternative the trenches can be filled with a crystalline silicon by an appropriate vapor phase epitaxy process to creat the sealed chamber 34.

At the step shown in FIG. 3k, after removing all residual deposited layers, a new insulating layer such as a borophospho-silicate glass layer 38 is deposited over the surface of the substrate 10. Contact pads or holes are formed in this insulating layer. Metal leads are formed by depositing a metal such as aluminum 36 and patterning the metal layer. A passivation layer 40 such as a phosphosilicate glass layer is deposited over the surface of the substrate and then bonding pads 46 are formed in this passivation layer. Thus the pressure sensor is completed.

FIG. 4a through 4i shows the process steps of a second embodiment of the present invention. The pressure sensor in this embodiment is also in chip form. The chip can typically have dimensions of 0.5 mm $\times$ 0.5 mm $\times$ 400 microns and contain a square diaphragm having dimensions of 0.14 mm $\times$ 0.14 mm $\times$ 2 microns with a cavity underlying the diaphragm having a size of 0.14 mm $\times$ 0.14 mm $\times$ 4 microns. Four resistors can be placed on the diaphragm which are aligned with the <110> direction and laid out at the edge of the diaphragm.

The main fabricating steps are explained as follows:

At the step shown in FIG. 4a, a silicon dioxide layer 18 which can typically have a thickness of 1000 Angstroms is formed on the surface of a silicon substrate typically (100) N-type silicon substrate 10 having a carrier concentration of $5 \times 10^{15}$ cm$^{-3}$ by thermal growth. A pattern is formed by photoetching for defining boron ion implantation regions 14. Boron ions are implanted into the substrate and then annealing is performed at a temperature between 900 and 1100 degrees centigrade. This process is designed to form resistors 14 having a predetermined surface carrier concentration and a predetermined sheet resistance value.

At the step shown in FIG. 4b after a thick photoresist layer is applied to the surface of the substrate, a pattern for defining a nitrogen ion implantation region 42 is formed by photography. Using the patterned photoresist layer as a mask, nitrogen ions are implanted into the substrate. The dose that can be used is $2 \times 10^{14}$ cm$^{-3}$ and the acceleration potential that is effective is 640 kev. Under this implantation condition, the resultant lattice disorder or high resistance layer 42 is about 2 microns thick.

At the step shown in FIG. 4c, protons are implanted into the substrate using a patterned thick photoresist layer as a mask. The proton implanted region 44 not only covers the whole nitrogen ion implanted region but also has some trench regions 28 out of the hydrogen ion implanted region as well as below the nitrogen ion implantation region. The function of these trench regions is the same as the low resistance trenches 28 described in the first embodiment. A dose used that is very effective is $3 \times 10^{15}$ cm$^{-2}$ and a typical acceleration potential would be 500 kev. After annealing at 450 degree centigrade in dry nitrogen, a low resistance layer having a thickness of about 6 microns is formed out of that portion of the proton implantation region that extends below the nitrogen implantation regions and the trench regions adjacent to the nitrogen implantation regions.

At the step shown in FIG. 4d, a successive layer of silicon dioxide 18, silicon nitrite 30 and high resistance polysilicon 16 is formed by low pressure vapor phase deposition.

Figure 4E:
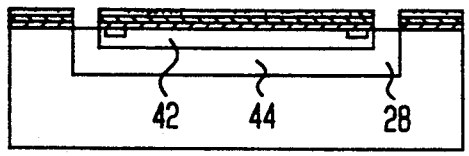

At the step shown in FIG. 4e, a pattern is formed in the composite layer by photoetching. This pattern is aligned with the trench regions and therefore provides entrances for the hydrofluoric acid solution to contact the low resistance region 28 formed by proton implantation at the edge of the high resistance region 42 formed by nitrogen ion implantation.

At the step shown in FIG. 4f, the low resistance trench regions 28 and the low resistance layer 44, buried under the high resistance layer 42, are converted into porous silicon 32 by anodization. The concentration of hydrofluoric acid solution which can be used is 30 w% or 50 w% and the anidic voltage which can be used is 7 or 5 volt. In about 20 to 30 minutes the anodization process will stop by itself.

At the step shown in FIG. 4g, the porous silicon 32 is removed by etching with 3 w% potassium hydroxide solution. This leaves a cavity 34.

At the step shown in FIG. 4h, the openings formed by removing the porous silicon in the trench regions are filled with polysilicon 16 deposited by low pressure vapor phase deposition. In this way the cavity 34 formed by removing the porous silicon between the high resistance layer and the substrate is sealed.

At the step shown in FIG. 4i, after removing unnecessary part of the polysilicon layer and cleaning all residual part of the composite layer, a new insulating layer such as a boro-phosphor-silicate glass layer 38 is formed over the surface of the substrate. Contact holes are formed in this insulating layer by photoetching. Metal leads are formed by depositing a metal such as aluminium 36 and photoetching. A passivation layer such as a phosphoro-silicate glass layer 40 is formed and then bonding pads 46 are formed in this passivation layer to end the process procedure of the pressure sensor.

Since the process of the fabricating pressure sensor of the present invention is compatible with a standard integrated circuit processing technology, it is very easy to form electronic components of a circuit for processing or analyzing the output signal of the pressure sensor which is implanted in the same chip.

According to the present invention, in the first fabrication method set forth in FIGS. 3a to 3k the diaphragm can be formed by combining diffusion and ion implantation to form a buried low resistance N-type layer and vapor phase epitaxy to form an overlayer. The buried layer can have a carrier concentration profile ranging between $10^{17}$ and $10^{21}$ cm$^{-3}$. The thickness of the buried layer defines the spacing of the cavity and the extension of the buried layer defines the spacing of the diaphragm. After forming the buried layer, an epitaxial layer is grown over the surface of the substrate. The epitaxial layer in the preferred embodiment is N-type and has a carrier concentration between $10^{15}$ and $10^{16}$ cm$^{-3}$. Since a part of the epitaxial layer becomes the diaphragm, the thickness of the epitaxial layer takes the value of a predetermined diaphragm thickness. Then several openings, trenches, 28 in FIGS. 3a-3k are formed by photoetching, in the preferred embodiment at the edge of the predetermined diaphragm region. In an alternate method, several low resistance N-type trenches are formed at the edge of the predetermined diaphragm region by diffusion or ion implantation. The silicon in these low resistance trenches convert into porous silicon during an anodization process and therefore provides channels for the anodization necessary to convert the buried low resistance layer into porous silicon.

Also according to the present invention, in the second fabrication method set forth in FIGS. 4a to 4i the diaphragm as noted is formed by a double ion implantation. The first ion implantation is used to create a lattice disorder layer which has temporal high resistance and the second ion implantation is used to create a high proton concentrated layer and trenches having low resistance. During the anodization process, the anodic current can enter the low resistance regions, 44 and 28, in FIGS. 4d and 4e but not the high resistance region 42 in FIG. 4d and 4e. Because of this, the low resistance regions become porous silicon 32 in FIG. 4f and the high resistance region remains unchanged.

Also in the preferred embodiment the double ion implantation process described in the second fabrication method, nitrogen ions are first implanted into a substrate through a mask; the used dose ranges between $10^{13}$ and $10^{15}$ cm$^{-2}$. The acceleration potential is chosen by considering a predetermined thickness of the diaphragm. Then protons are implanted into the substrate. The mask used has a window or opening which not only covers the nitrogen ion implanted region but also has several trench regions within the region. The dose ranges are between $10^{14}$ and $10^{16}$ cm$^{-2}$. The acceleration potential is chosen to produce a concentrated proton layer which will have a depth a little greater than the thickness of the nitrogen ion implanted layer. After implantation, the implanted protons are activated by annealing at 400–500 degrees centigrade in dry nitrogen. The lattice disorder in the nitrogen ion implanted layer is removed by post-diaphragm-forming high temperature thermal treatment.

According to the present invention, a hydrofluoric acid resisting layer is used as an etching mask for anodization of silicon in a hydrofluoric acid solution. This layer is preferably a composite layer consisting of a lower silicon dioxide layer, a middle silicon nitride layer and an upper high resistance polysilicon layer.

According to the present invention, the anodization of silicon is performed in a hydrofluoric acid solution having a concentration of hydrofluoric acid between 10 w% and 50 w%. The hydrofluoric acid solution is made by adding water or ethanol to a 50 w% hydrofluoric acid solution FIGS. 4f and 3h reflect this step. During the anodization process, the anodic voltage is kept at a constant value between 4 and 10 volt. Among the equipment that can be used for the anodization is a teflon electrochemical cell. The cell is separated into two parts by a substrate to be anodized. Two platinum plates are used as anodic and cathode electrodes. The back side of the substrate faces the anodic electrode and the upper side faces the cathode electrode.

According to the present invention, the porous silicon formed in the anodization is removed by etching in a diluted alkaline solution such as a potassium hydroxide solution, sodium hydroxide solution or ammonium hydroxide solution. The concentration of the used akaline solution ranges from 1 w% to 5 w% FIGS. 3i and 4b reflect this step.

According to the present invention, the openings are preferably filled with polysilicon or silicon dioxide. Selective epitaxial growth of silicon into the openings is an alternate way.

Compared with the conventional process of fabricating a silicon diaphragm piezoresistive pressure sensor, the present invention has the following advantages:

a. High processing accuracy and high reproducibility since the shape of the cavity and the dimension of the diaphragm are easily defined by masked diffusion or ion implantation.

b. Capable of producing a very thin diaphragm required in a pressure sensor with high sensitivity because the thickness of the diaphragm is defined by the epitaxial growth.

c. High compactness since only a little silicon is removed from the substrate to form the cavity and therefore the strength of the device and chip is negligibly affected.

d. Simple packaging because of the sealed internal reference pressure chamber.

e. High compatibility with integrated circuit processing technologies so it is easy to fabricate an efficient and high quality sensor within an integrated circuit.

What is claimed:

1. A method of fabricating a pressure sensor, including a substrate, a diaphragm having at least a piezoresistor, a sealed chamber within said substrate, said diaphragm overlying said chamber, and one or more trenches filled with a sealing material, wherein said one or more trenches are adjacent to said diaphragm and said chamber, and wherein said chamber is formed by said substrate, said one or more trenches and said diaphragm, said method comprising:

a first step of forming a low resistance N-type silicon layer buried under an overlying layer designed to be said diaphragm and at least a low resistance N-type material filled trench which penetrates the overlying layer and connects with said low resistance N-type silicon layer;

a second step of converting said low resistance material and low resistance layer into porous silicon by anodization of silicon;

a third step of removing said porous silicon by etching; and a fourth step of filling an opening which is formed by removing the porous silicon in the trench with a sealing material.

2. The method of claim 1, wherein said low resistance layer and low resistance material filled trench are formed by a process comprising:

forming a low resistance layer in a predetermined region on said substrate by diffusion or ion implantation;

growing a lightly doped N-type silicon epitaxial layer over said substrate; and forming at least a low resistance material filled trench in a predetermined region in said epitaxial layer by diffusion or ion implantation which penetrates said epitaxial layer and butts said low resistance layer.

3. The method of claim 1, wherein said low resistance layer and low resistance trench are formed by a process comprising:

forming a lattice disorder layer in a predetermined surface region of said substrate by electrically inactive ion implanation;

forming a buried concentrated proton layer under said lattice disorder layer by proton implantation using a mask in which a defined proton implantation region covers said electrically inactive ion implantation region including a trench region which is designed to become said low resistance trench; and annealing said substrate at 400-500 degrees centigrade in dry nitrogen to activate implanted protons and form said low resistance layer and said low resistance trench.

4. The method of claim 1 wherein said anodization of silicon is performed in a hydrofluoric acid solution having a concentration of hydrofluoric acid between 10 w% and 50 w%.

5. The method of claim 1 wherein said anodization of silicon is performed at a constant anodic voltage ranging between 4 and 10 volts.

6. The method of claim 1 wherein said etching of said porous silicon is performed in a diluted alkaline solution.

7. The method of claim 6, wherein said diluted alkaline solution is selected from a group consisting of potassium hydroxide solution, sodium hydroxide solution, and ammonia hydroxide solution having a concentration between 1 w% and 5 w%.

8. The method of claim 1, wherein said sealing material is selected from a group consisting of polysilicon, silicon dioxide, and crystal silicon.

9. A process or method for fabricating a pressure sensor comprising:

forming a buried layer in a substrate with a cavity material that can be later altered and, removed without affecting surrounding structure said substrate having a planar surface extending over said buried layer;

overlaying said buried layer with a diaphragm;

forming a plurality of connections comprising cavity material from the substrate surface through said diaphragm to said buried layer;

removing the cavity material from both the buried layer and connections without damaging or altering the surrounding structure to simultaneously form a cavity under the diaphragm and trenches connecting the cavity to the substrate surface;

creating an air tight seal around the cavity by filling the trenches with a sealing material; and placing on an outside surface of the diaphragm and the substrate, means to detect changes of pressure between the sealed cavity and the outside surface.

10. A process or method for fabricating a pressure sensor comprising:

using as a base a semiconductor substrate;

forming a low resistance layer on one side of the semiconductor substrate, under a predetermined diaphragm region;

forming a diaphragm in the predetermined diaphragm region;

forming one or more trenches located at an edge of the predetermined diaphragm region through the diaphragm to the low resistance layer under the diaphragm;

filling the trenches with a low resistance material;

converting the low resistance material in the trenches and the low resistance layer under the diaphragm to porous silicon by anodization;

removing the porous silicon by etching, to produce a chamber under the diaphragm;

filling the trenches with a sealing material to form a pressure reference chamber; and forming means on an exposed surface of the substrate and diaphragm to detect changes in pressure with the pressure reference chamber.

11. A process or method for fabricating a pressure sensor comprising:
   using a semiconductor substrate as a base;
   forming a chamber on the top of the semiconductor substrate;
   filling the chamber with a layer of low resistance material;
   forming a diaphragm over the layer of low resistance material;
   forming at an edge of the diaphragm one or more trenches which extend from the surface of the substrate and diaphragm down to the layer of low resistance material under the diaphragm;
   filling the trenches with low resistance material;
   anodizing the low resistance material in the layer under the diaphragm and in the trenches to produce porous silicon;
   removing the porous silicon beneath the diaphragm and in the trenches;
   filling the trenches with a sealing material to form a sealed buried reference chamber; and
   forming means on an exterior surface of the substrate and the diaphragm to detect changes in pressure between the buried reference chamber and the exterior surface.

12. A process or method for fabricating a pressure sensor comprising:
   using a semiconductor substrate as a base;
   defining a nitrogen ion implantation region on the top of the semiconductor substrate;
   implanting nitrogen ions to a specific depth in the nitrogen implantation region to form a diaphragm;
   defining a proton implantation region on the top of the semiconductor substrate which encompasses the diaphragm as well as one or more trench regions adjacent to the diaphragm;
   implanting protons in the proton implantation region to a predetermined depth in the semiconductor substrate, the proton implantation region extending below the diaphragm as well as into the adjacent trench regions;
   annealing the semiconductor substrate to form a low resistance material in the proton implantation region beneath the diaphragm and in the trench regions;
   anodizing the low resistance material to produce porous silicon;
   removing the porous silicon to form a chamber beneath the diaphragm and one or more trenches in the trench regions connected to said chamber;
   filling the trenches to seal the chamber beneath the diaphragm and form a sealed reference chamber; and
   forming means on the exterior of the diaphragm and substrate to detect changes in pressure between the chamber and the exterior surface.

13. A process or method for fabricating a pressure sensor comprising:
   using an N-type silicon semiconductor substrate as a base;
   forming a silicon dioxide layer on one surface of the N-type silicon substrate;
   photoetching a pattern on to the silicon dioxide layer to define an ion implantation region;
   removing the silicon dioxide in the defined ion implantation region;
   implanting arsenic ions using the pattern of silicon dioxide layer as a mask;
   thermally annealing the implanted region to form a low resistance layer;
   removing the remainder of the silicon dioxide from the surface of the substrate;
   forming a lightly doped N-type silicon epitaxial layer to serve as a diaphragm on the surface of the substrate above the low resistance layer, the epitaxial layer being formed by vapor phase epitaxy;
   forming a second layer of silicon dioxide on top of the surface of the substrate and the epitaxial layer;
   defining a first ion implantation region on the second silicon dioxide layer, said defined first implantation region being at the edge of the diaphragm;
   removing the silicon dioxide in the first defined ion implantation region;
   implanting phosphorous ions in the first ion implantation region using the second silicon dioxide layer as a mask;
   annealing of the phosphorous ion implantation region to form low resistance material filled trenches which run from the surface of the substrate at the edge of the diaphragm to the low resistance layer beneath the diaphragm;
   reforming the silicon dioxide layer over the first ion implantation region;
   defining one or more second ion implantation regions on the diaphragm;
   implanting boron ions in the second implantation regions to form strain gages;
   forming a silicon nitrate layer over the entire surface;
   forming a high resistance layer of polysilicon over the layer of silicon nitrate;
   photoetching a pattern aligned with the first ion implantation region to expose the top of the trenches filled with the low resistance material;
   converting the low resistance material in the trenches and the low resistance layer under the diaphragm to porous silicon by anodization;
   removing the porous silicon in the trenches and beneath the diaphragm by etching, to form a chamber beneath the diaphragm;
   filling the trenches with silicon to form a sealed chamber beneath the diaphragm;
   insulating the top of the substrate and diaphragm; and
   forming means to make contact between the strain gauges and other circuit elements on the diaphragm and substrate to form contacts off the diaphragm and substrate.

14. A process or method for fabricating a pressure sensor comprising:
   using an N-type silicon substrate as a base;
   forming a first silicon dioxide layer on a top surface of the N-type silicon substrate;
   photoetching a pattern on the first silicon dioxide layer to define a boron ion implantation region;
   removing the silicon dioxide in the defined boron ion implantation region;
   implanting boron ions in the defined boron ion implantation region using the patterned silicon dioxide layer as a mask;
   annealing the silicon substrate to form piezoresistive elements in the boron ion implantation region;
   forming a thick photoresist layer on the top of the surface of the N-type silicon substrate;
   forming a pattern on top of the thick photoresist layer for a nitrogen implantation region by photography;
   using the patterned photoresist layer as a mask for implantation of nitrogen ions, implanting nitrogen ions in the defined nitrogen ion implantation region, said nitrogen ion implantation region serving as a diaphragm;

defining a proton implantation region on top of the N-type silicon substrate by enlarging the size of the nitrogen ion implantation region to include trench regions adjacent to the edge of the nitrogen implantation region, said step being done by enlarging the photoresist mask;

implanting protons in the proton implantation region, said proton implantation region extending below the diaphragm;

annealing the proton implantation region at a temperature of 400°-500° C. in dry nitrogen to form a low resistance layer beneath the diaphragm and one or more low resistance material filled trenches adjacent to the diaphragm in the trench regions;

removing the remainder of the first silicon dioxide layer;

forming on top of the substrate a second silicon dioxide layer;

forming over the second silicon dioxide layer a layer of silicon nitride;

forming over the layer of silicon nitride a layer of polysilicon;

forming a pattern on top of the polysilicon layer which is aligned with the trenches adjacent to the diaphragm, and removing in the pattern region successive layers of polysilicon, silicon nitride and silicon dioxide to expose the tops of the trenches;

converting the low resistance material in the trenches and the low resistance material beneath the diaphragm into porous silicon by anodization;

removing the porous silicon by etching to form a chamber beneath the diaphragm;

filling the trenches with silicon to seal the chamber beneath the diaphragm and form a buried reference chamber;

removing unnecessary parts of the polysilicon layer;

removing the remainder of the portions of the silicon nitride and silicon dioxide layers from the top of the substrate;

forming an insulating layer over the top of the substrate surface;

forming contact holes by photoetching to provide contact to the strain gauges formed on the surface of the diaphragm;

forming a passivation layer over the top of the silicon substrate and diaphragm; and forming bonding pads to the contact holes.

* * * * *